United States Patent [19]
Yoshida

[11] Patent Number: 5,950,080
[45] Date of Patent: Sep. 7, 1999

[54] SEMICONDUCTOR DEVICE AND METHOD OF MANUFACTURING THE SAME

[75] Inventor: Hiroshi Yoshida, Tokyo, Japan

[73] Assignee: NEC Corporation, Tokyo, Japan

[21] Appl. No.: 09/059,830

[22] Filed: Apr. 14, 1998

[30]     Foreign Application Priority Data

Apr. 15, 1997   [JP]   Japan .................................. 9-097550

[51] Int. Cl.⁶ ............................................... H01L 21/8238
[52] U.S. Cl. .......................... 438/202; 438/372; 438/375; 438/235; 438/309
[58] Field of Search ..................... 438/202, 203, 438/205, 206, 207, 234, 235, 236, 309, 322, 340, 364, 365, 373, 375, 372

[56]         References Cited

U.S. PATENT DOCUMENTS

| | | | |
|---|---|---|---|
| 4,151,009 | 4/1979 | Ogureck et al. | 438/309 |
| 4,484,388 | 11/1984 | Iwasaki | 438/207 |
| 4,855,245 | 8/1989 | Neppl et al. | 438/207 |
| 5,001,073 | 3/1991 | Huie | 438/203 |
| 5,071,778 | 12/1991 | Solheim | 438/370 |
| 5,118,633 | 6/1992 | Sagara et al. | 438/207 |
| 5,187,109 | 2/1993 | Cook et al. | 438/339 |
| 5,470,766 | 11/1995 | Lien | 438/419 |
| 5,698,459 | 12/1997 | Grubisich et al. | 438/350 |
| 5,780,329 | 7/1998 | Randazzo et al. | 438/202 |

OTHER PUBLICATIONS

K. Ishimaru, et al, Bipolar Installed CMOS Technology without Any Process Step Increase for High Speed Cache SRAM,1995 IEEE, pp. 3,4,5,6, Japan.

*Primary Examiner*—Peter Toby Brown
*Assistant Examiner*—Khanh Duong

[57]          ABSTRACT

In a semiconductor device manufacturing method, a buried collector region (5) of a bipolar transistor is formed, and then born is ion-implanted into at least the lower portion of a graft base region (15) to form a region (10) having a low donor concentration, whereby the capacitance between the collector and the base of the bipolar transistor can be reduced to achieve a high-speed operation of a circuit.

7 Claims, 8 Drawing Sheets

SEMICONDUCTOR DEVICE AND METHOD OF MANUFACTURING THE SAME

BACKGROUND OF THE INVENTION

1. Field of the Invention

The present invention relates to a semiconductor device and a method of manufacturing a semiconductor device and, particularly to a semiconductor device and manufacturing method thereof in which a bipolar transistor is formed on a substrate or both a bipolar transistor and a complementary MOS (CMOS) transistor are formed on the same substrate.

2. Description of the Related Art

Figure 1:
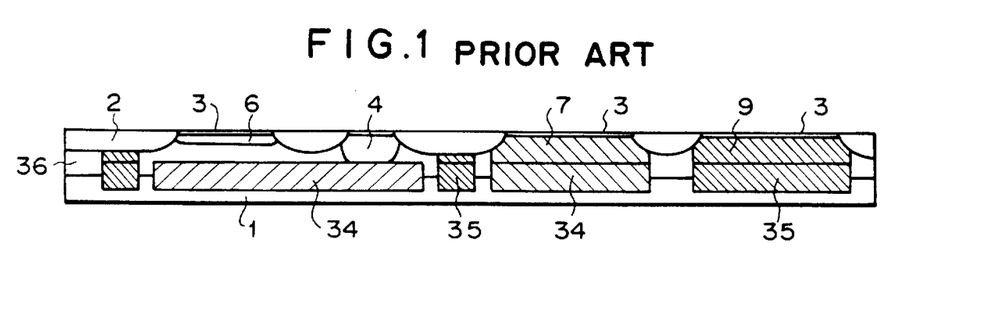
FIG. 1 is a cross-sectional view showing a process of a first prior art.

According to a conventional semiconductor device manufacturing method as described above, as shown in FIG. 1, an n-type epitaxial layer 36 is formed on a p-type silicon substrate 1 on which an n-type buried layer 34 and a p-type buried layer 35 are formed, and then a field oxide film 2 is formed at a thickness of 3000 to 6000 angstroms by LOCOS method. Thereafter, an n-well region 7, a base region 6 of a bipolar transistor and an n-type collector leading region 4 are formed, and then a gate oxide film 3 of 50 to 200 angstroms in film thickness is formed.

Figure 2:
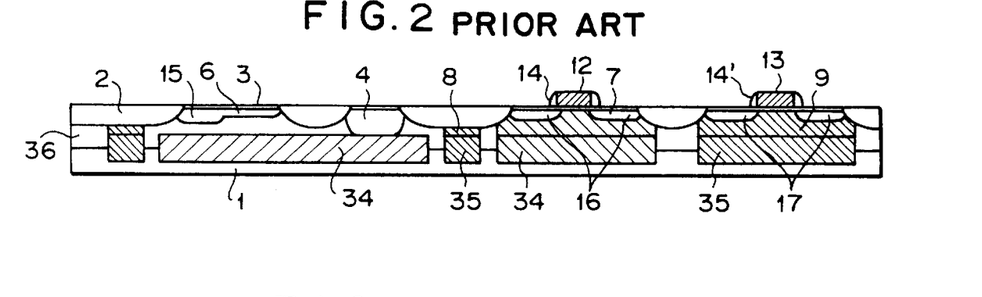
FIG. 2 is a cross-sectional view showing a subsequent process of the first prior art.

Subsequently, as shown in FIG. 2, a polysilicon layer of 1500 to 2000 angstroms which is formed on the whole surface is patterned to form a PMOS gate electrode 12 and an NMOS gate electrode 13. Thereafter, an oxide film is deposited at a thickness of 1000 angstroms, and an anisotropic dry etching is performed to form side walls 14, 14' on the side surfaces of the gate electrodes 12, 13 respectively. Subsequently, boron is doped at a dose amount of 5 to $9 \times 10^{15} \text{cm}^{-2}$ into a graft base region 15 of the bipolar transistor, the gate electrode 12 of PMOS transistor and the source and drain regions 16 of PMOS transistor by ion implantation. Arsenic is doped at a dose amount of 1 to $2 \times 10^{16} \text{cm}^{-2}$ into the gate electrode 13 of NMOS transistor and the source and drain regions 17 of NMOS transistor by ion implantation. Phosphor may be used as n-type impurities.

Figure 3:
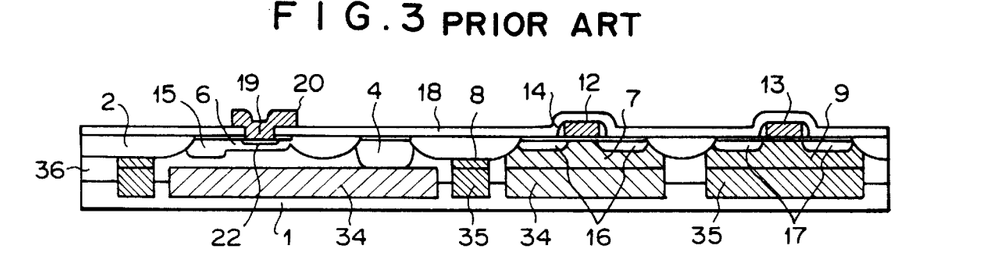
FIG. 3 is a cross-sectional view showing a subsequent process of the first prior art.

Subsequently, as shown in FIG. 3, an emitter contact (opening) 19 is formed in an oxide film 18 of 1000 to 2000 angstroms in thickness which are grown on the whole surface, and then a polysilicon layer is formed at a thickness of 1500 to 2000 angstroms on the overall surface. Subsequently, arsenic is doped at a dose amount of 1 to $2 \times 10^{16} \text{cm}^{-2}$ into the polysilicon layer by ion implantation, and then the polysilicon layer is patterned to form an emitter electrode 20 of the bipolar transistor. Thereafter, a heat treatment is performed to diffuse arsenic from the polysilicon layer of the emitter electrode 20 to the base region 6, thereby forming an emitter region 22.

Figure 4:
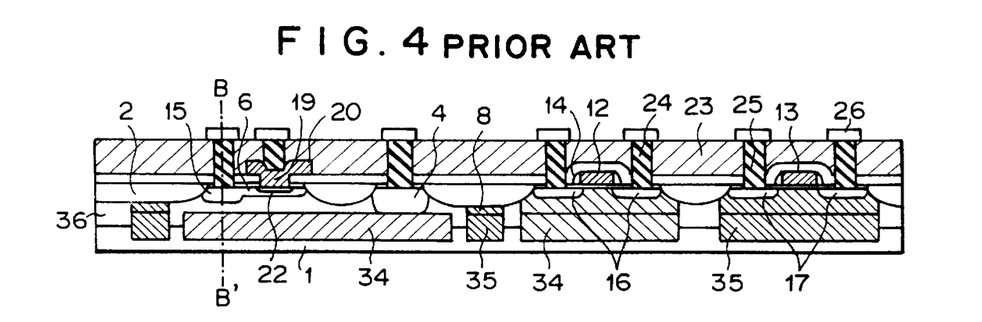
FIG. 4 is a cross-sectional view showing a subsequent process of the first prior art.

Next, as shown in FIG. 4, an interlayer insulating film 23 is deposited on the elements which have been formed through the above process, and a contact (opening) 24 is formed therein. Thereafter, a plug 25 of tungsten or the like is formed in the contact 24, and each metal wire 26 is formed to thereby complete a semiconductor device.

In the case of the above-described method, if the concentration of the impurities of the n-type epitaxial layer 36 is set to a low value (about 1 to $5 \times 10^{15} \text{cm}^{-2}$) and the n-type buried layer 34 which is connected to the collector leading region 4 and contains impurities at high concentration is provided below the n-type epitaxial layer 36, not only the collector resistance of the bipolar transistor can be reduced, but also the withstanding voltage of the bipolar transistor can be prevented from being reduced. However, this method needs a lithography process and a heat treatment process for formation of the buried layers, and an epitaxial growth process, and thus it has a disadvantage that the manufacturing cost necessarily rises up. As a method of solving this problem, K. Ishimaru, et al. ("International Electron Device Meeting", 1995, pp. 673) has proposed a manufacturing method which needs no buried layer forming process and no epitaxial growth process.

The proposed manufacturing method will be described with reference to FIGS. 5 to 8.

Figure 5:
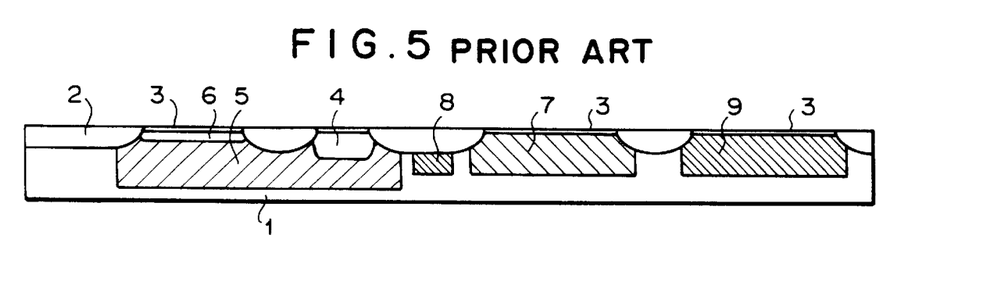
FIG. 5 is a cross-sectional view showing a process of a second prior art.

First, as shown in FIG. 5, a field oxide film 2 of 3000 to 6000 angstroms in thickness is formed on a p-type silicon substrate 1 by the LOCOS method, and then a gate oxide film 3 is grown to have a thickness of 50 to 200 angstroms. Subsequently, ion-implantation processes are performed by using as a mask in each process a patterned photoresist layer (not shown) formed by a photolithography process to thereby form an n-type collector leading region 4, a buried collector region 5 and a base region 6 of a bipolar transistor and an n-well region 7 for PMOS transistor and a p-well region 9 for NMOS transistor. The collector resistance of the bipolar transistor can be reduced by increasing the dose amount of the n-type impurities which are doped to form the buried collector region 5.

Figure 6:
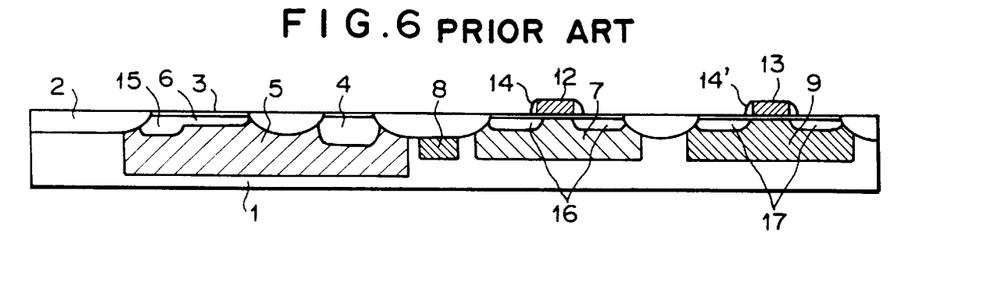
FIG. 6 is a cross-sectional view showing a subsequent process of the second prior art.

Subsequently, as shown in FIG. 6, a polysilicon layer which is grown at a thickness of 1500 to 2000 angstroms on the overall surface is etched to form a gate electrode 12 of PMOS transistor and a gate electrode 13 of NMOS transistor. Thereafter, an oxide film is deposited at a thickness of 1000 angstroms, and then an anisotropic dry etching treatment is performed to form side walls 14, 14' on the side surfaces of the gate electrodes 12 and 13, respectively. Subsequently, boron is doped at a dose amount of 5 to $9 \times 10^{15} \text{cm}^{-2}$ into a graft base region 15 of the bipolar transistor and the gate electrode 12 and the source and drain regions 16 of PMOS transistor by ion implantation. Further, arsenic is doped at a dose amount of 1 to $2 \times 10^{16} \text{cm}^{-2}$ into the gate electrode 13 and the source and drain regions 17 of NMOS transistor by ion implantation. Phosphor may be used as the n-type impurities.

Figure 7:
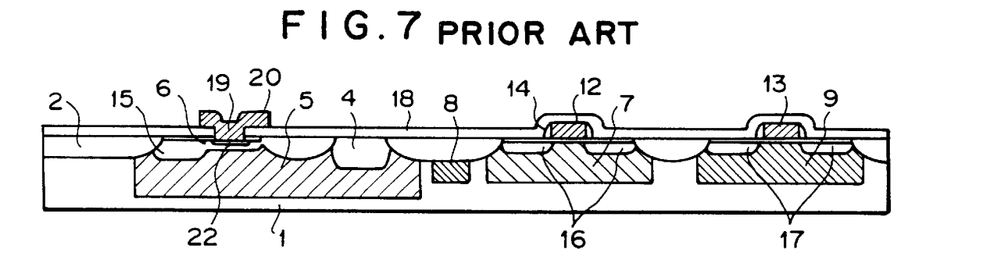
FIG. 7 is a cross-sectional view showing a subsequent process of the second prior art.

Subsequently, as shown in FIG. 7, an emitter contact 19 is formed in an oxide film 18 which is grown at a thickness of 1000 to 2000 angstroms on the overall surface, and then a polysilicon layer is grown at a thickness of 1500 to 2000 angstroms on the overall surface. Thereafter, arsenic is doped at a dose amount of 1 to $2 \times 10^{16} \text{cm}^{-2}$ into the polysilicon layer by ion implantation, and the polysilicon layer is patterned to form an emitter electrode 20 of the bipolar transistor. Thereafter, the heat treatment is performed in a nitrogen atmosphere at 850 to 900° C. to activate the ion-implanted impurities. At this time, arsenic is diffused from the polysilicon layer of the emitter electrode 20 of the bipolar transistor to the base region 6 to form an emitter region 22.

Figure 8:
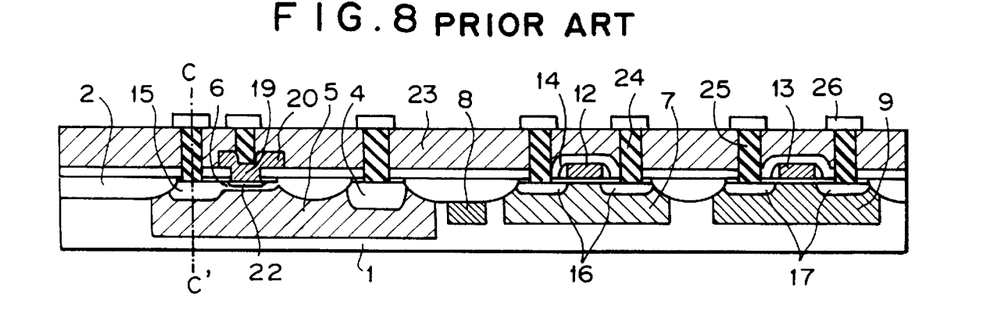
FIG. 8 is a cross-sectional view showing a subsequent process of the second prior art.

Subsequently, as shown in FIG. 8, an interlayer insulating film 23 is deposited on the elements formed in the above process, and a contact 24 is formed. Thereafter, a plug 25 of tungsten or the like is formed, and each metal wire 26 is formed to thereby complete a semiconductor device.

Figure 9:
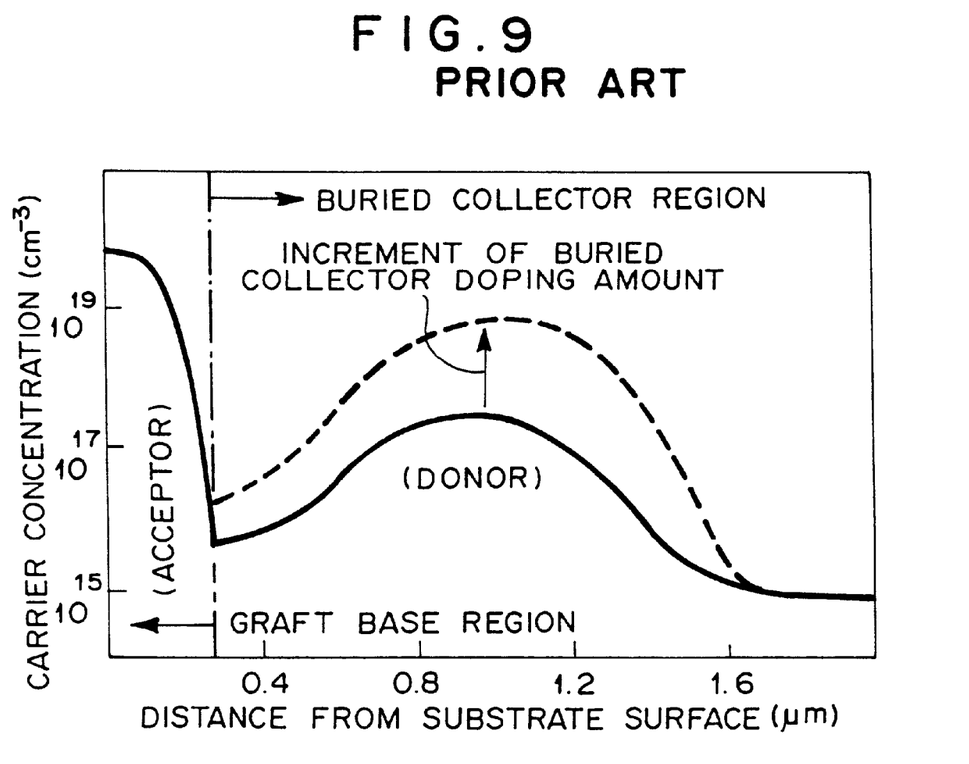
FIG. 9 is a diagram showing a carrier concentration distribution on a line C–C' of FIG. 8.

According to the above manufacturing method, the concentration of the doped impurities to form the buried collector region 5 is increased to reduce the collector resistance. However, as shown in FIG. 9, the increase of the amount of the doped impurities causes increase in the concentration of donors in an area which come into contact with the high-concentration p-type impurities diffusing region (the graft base area 15 of the bipolar transistor), so that parasitic capacitance is increased and the withstanding voltage is reduced.

As described above, in the conventional manufacturing method, if the collector resistance of the bipolar transistor is increased, the number of manufacturing steps is increased, and also the increase of the parasitic capacitance of the transistor and the reduction of the withstanding voltage are caused.

SUMMARY OF THE INVENTION

An object of the present invention is to provide a semiconductor device manufacturing method which can reduce the number of manufacturing steps without deteriorating characteristics of bipolar transistor.

In order to attain the above object, according to the present invention, there is provided a method of manufacturing a semiconductor device having a bipolar transistor, comprising:

a step of doping second conduction type impurities into a first conduction type semiconductor substrate to form a buried collector region of the bipolar transistor; and a step of doping into a part of the buried collector region first conduction type impurities an amount of which is smaller than that of the second conduction type impurities to form a low concentration second conduction type impurity region.

In an aspect of the present invention, a graft base region communicating to a base region of the bipolar transistor is formed adjacent to the low concentration second conduction type impurity region. The low concentration second conduction type impurity region may be formed after the base region is formed.

In an aspect of the present invention, first conduction type impurities are doped into the low concentration second conduction type impurity region to form both a base region of the bipolar transistor and a graft base region communicating to the base region.

In an aspect of the present invention, the buried collector region is formed while second conduction type impurities are doped into an area of the semiconductor substrate other than that of the bipolar transistor to form a second conduction type well for forming MOS transistor.

In an aspect of the present invention, the low concentration second conduction type impurity region is formed while first conduction type impurities are doped into an area of the semiconductor substrate other than that of the bipolar transistor to form a first conduction type well for forming MOS transistor.

According to the present invention, there is provided a method of manufacturing a semiconductor device having a bipolar transistor and CMOS transistor, comprising:

a step of doping second conduction type impurities into a first conduction type semiconductor substrate to form a buried collector region of the bipolar transistor, while second conduction type impurities are doped into a first area of the semiconductor substrate other than that of the bipolar transistor to form a second conduction type well for forming a first MOS transistor of the CMOS transistor; and a step of doping into a part of the buried collector region first conduction type impurities an amount of which is smaller than that of the second conduction type impurities to form a low concentration second conduction type impurity region, while first conduction type impurities are doped into a second area of the semiconductor substrate other than that of the bipolar transistor to form a first conduction type well for forming a second MOS transistor of the CMOS transistor.

There is also provided a semiconductor device having a bipolar transistor, comprising:

a first conduction type semiconductor substrate;

a graft base region communicating to a base region of the bipolar transistor; and a low concentration second conduction type impurity region formed in a buried collector region of the bipolar transistor so as to exist adjacent to the graft base region.

Here, the low concentration second conduction type impurity region may be positioned adjacent to the base region, and CMOS transistor may be formed on the semiconductor substrate.

According to the present invention, by reducing the concentration of the impurities at the lower portion of the graft base of the bipolar transistor, the capacitance between the base and the collector can be reduced, and the high-speed operation of the circuit and the saving of the power consumption can be achieved.

DETAILED DESCRIPTION OF THE PREFERRED EMBODIMENTS

Preferred embodiments according to the present invention will be described hereunder with reference to the accompanying drawings.

(Embodiment 1)

Figure 10:
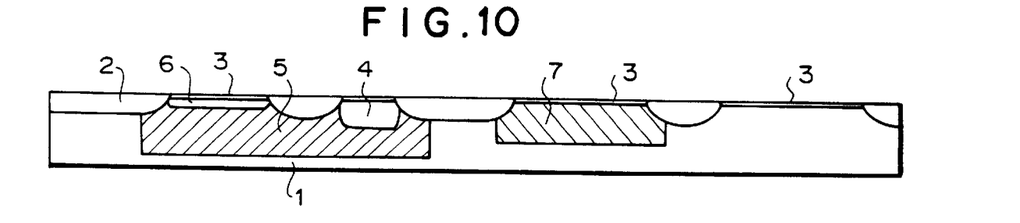
FIG. 10 is a cross-sectional view showing a process of an embodiment 1 of the present invention.

In a semiconductor device manufacturing method according to an embodiment 1 of the present invention, as shown in FIG. 10, a field oxide film 2 of 3000 to 6000 angstroms is first formed on a p-type silicon substrate 1 by the LOCOS method, and then a gate silicon oxide film 3 is grown at a thickness of 50 to 200 angstroms. Subsequently, ion-implantation processes are performed, in which phosphor, boron or the like is ion-implanted by using as a mask a photoresist layer (not shown) which is patterned by a photolithography process, thereby forming an n-type collector leading region 4, a buried collector region 5 and a base region 6 of a bipolar transistor and an n-well region 7 for PMOS transistor.

Figure 11:
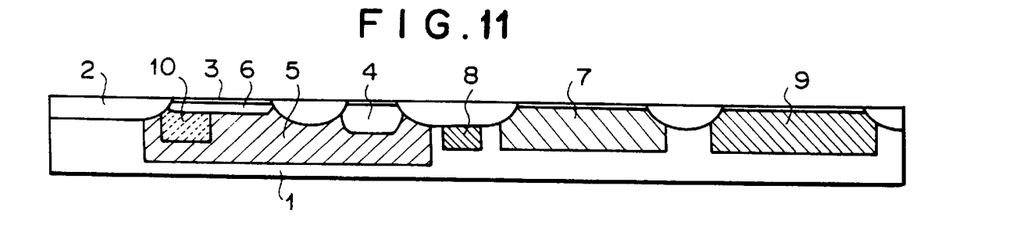
FIG. 11 is a cross-sectional view showing a subsequent process of the embodiment 1 of the present invention.

Subsequently, as shown in FIG. 11, ion-implantation of boron is performed by using a photoresist (not shown) as a mask to form an element separating region 8 and a p-well region 9 for NMOS transistor. At the same time, boron is doped into a part of the base region 6 of the bipolar transistor to compensate for the concentration of the impurities of the buried collector region 5, thereby forming an n-type impurity region 10 having a low donor concentration.

Figure 12:
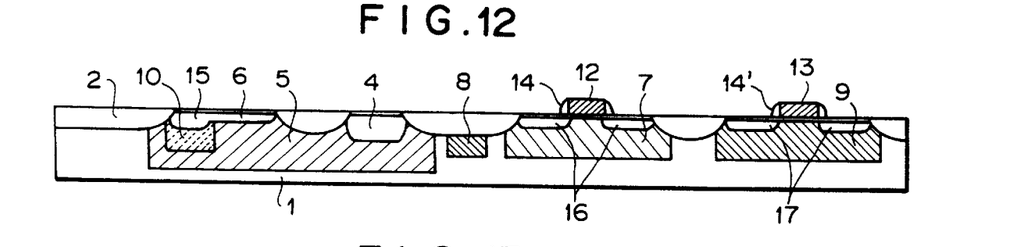
FIG. 12 is a cross-sectional view showing a subsequent process of the embodiment 1 of the present invention.

Subsequently, as shown in FIG. 12, a polysilicon layer which is grown at a thickness of 1500 to 2000 angstroms on the overall surface is etched to form a gate electrode 12 of PMOS transistor and a gate electrode 13 of NMOS transistor. Thereafter, a silicon oxide film is deposited at a thickness of 1000 angstroms, and then an anisotropic dry etching treatment is performed to form side walls 14, 14' on the side surfaces of the gate electrodes 12 and 13, respectively. Subsequently, boron is ion-implanted at a dose amount of 5 to $9\times10^{15}$cm$^{-2}$ into a graft base region 15 of the bipolar transistor and the gate electrode 12 and the source and drain regions 16 of PMOS transistor. Further, arsenic is ion-implanted at a dose amount of 1 to $2\times10^{16}$cm$^{-2}$ into the gate electrode 13 and the source and drain regions 17 of NMOS transistor. Phosphor is used as the n-type impurities.

Figure 13:
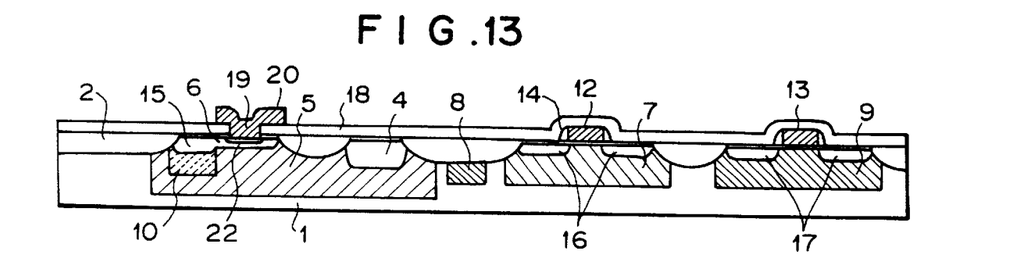
FIG. 13 is a cross-sectional view showing a subsequent process of the embodiment 1 of the present invention.

Subsequently, as shown in FIG. 13, an emitter contact (opening) 19 is formed in a silicon oxide film which is grown at a thickness of 1000 to 2000 angstroms on the overall surface, and then a polysilicon layer 20 is grown at a thickness of 1500 to 2000 angstroms on the overall surface. Thereafter, arsenic is ion-implanted at a dose amount of 1 to $2\times10^{16}$cm$^{-2}$ into the polysilicon layer 20, and then the polysilicon layer 20 is patterned to form an emitter electrode 20 of the bipolar transistor.

Thereafter, a heat treatment is performed in a nitrogen atmosphere at 850 to 900° C. to activate the doped impurities. At this time, arsenic is diffused from the polysilicon layer of the emitter electrode 21 of the bipolar transistor to the base region 6 to form an emitter region 22.

Figure 14:
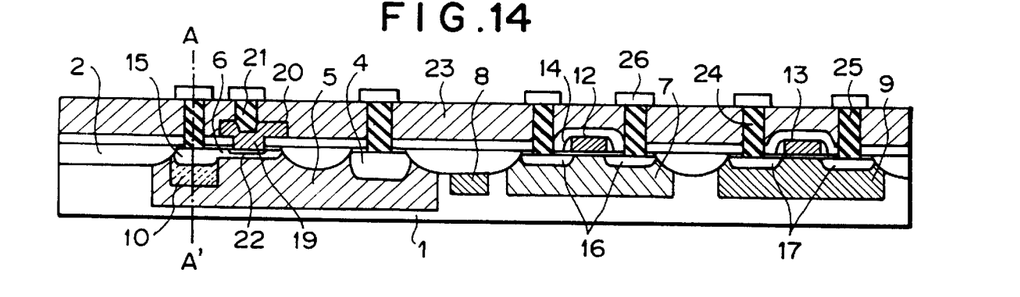
FIG. 14 is a cross-sectional view showing a subsequent process of the embodiment 1 of the present invention.
Figure 15:
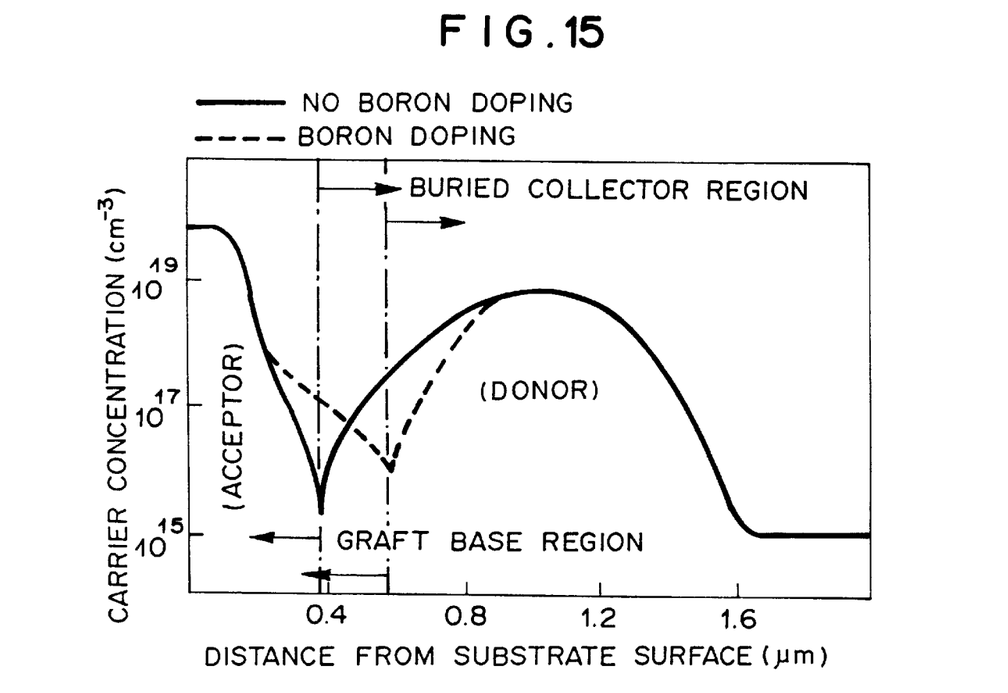
FIG. 15 is a diagram showing a carrier concentration distribution on a line A–A' of FIG. 14.

Subsequently, as shown in FIG. 14, an interlayer insulating film 23 is deposited on the elements which has been formed in the above process, and a contact hole (opening) 24 is formed in the interlayer insulating film 23. Thereafter, a plug 25 made of tungsten or the like is formed in the contact hole 24, and a metal wire 26 is formed to thereby obtain a semiconductor device.

In the embodiment 1, boron is doped to the lower side of the graft base region 15, whereby the donor concentration is lowered and the junction capacitance between the graft base region 15 and the buried collector region 5 can be reduced.

Figure 16:
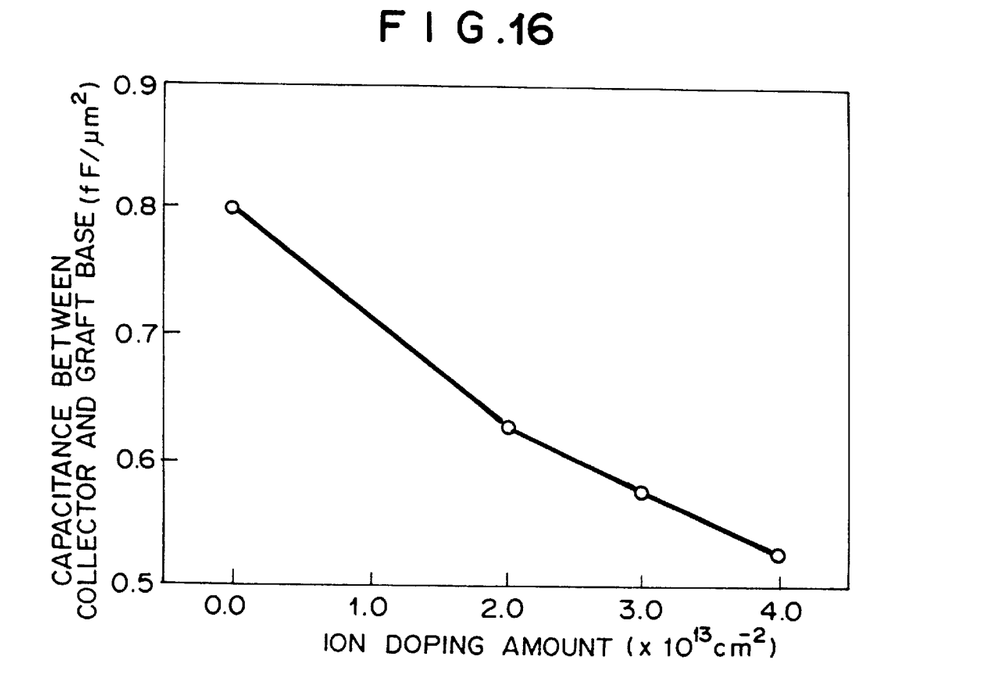
FIG. 16 is a diagram showing dependence of collector-base capacitance on boron doping amount.

FIG. 16 is a characteristic diagram showing the dependence of the junction capacitance between the collector and the graft base on the dose amount of boron when the buried collector region 5 is formed under the conditions: phosphor ion-implantation energy of 900 KeV and dose amount of $3\times10^{14}$cm$^{-2}$, and boron is doped into the graft base region at 330 KeV. As is apparent from FIG. 16, when the dose amount of boron is increased, the junction capacitance is reduced. Here, the p-well 9 is also formed by the doping of boron at the same time, and thus the dose amount must be set appropriately in consideration of the fact that the dependence of the threshold voltage of NMOS on the substrate voltage becomes greater.

(Embodiment 2)

FIGS. 17 to 22 are cross-sectional views showing a process of the semiconductor device manufacturing method according to an embodiment 2 of the present invention.

Figure 17:
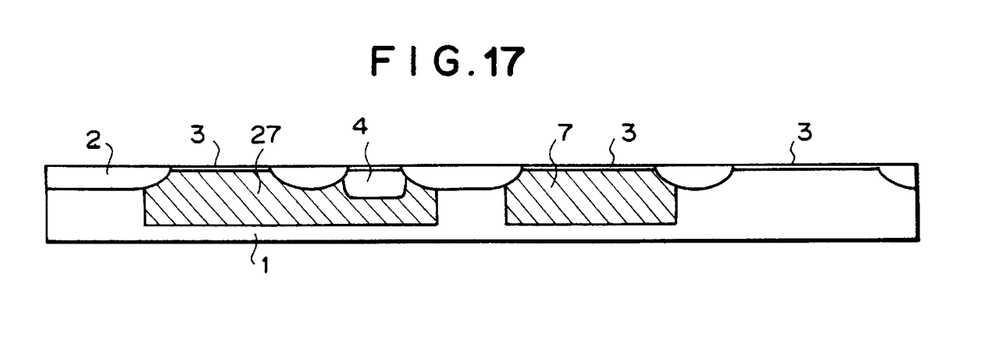
FIG. 17 is a cross-sectional view showing a process of an embodiment 2 of the present invention.

First, as shown in FIG. 17, a field oxide film is formed at a thickness of 3000 to 6000 angstroms on a p-type silicon substrate 1 by the LOCOS method, and then a gate silicon oxide film 3 is grown at a thickness of 50 to 200 angstroms. Subsequently, ion-implantation is performed by using as a mask a photoresist which is patterned in a photolithography process, thereby forming an n-type collector leading region 4, and then an n-well region 7 for PMOS transistor and a buried collector region 27 are formed by the same lithography process and the same ion-implantation process.

Figure 18:
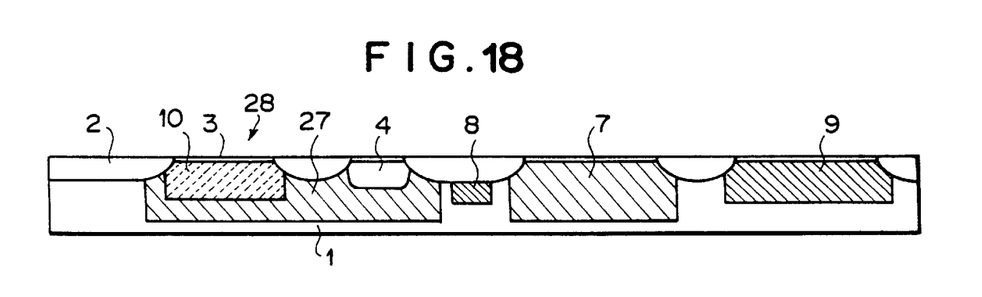
FIG. 18 is a cross-sectional view showing a subsequent process of the embodiment 2 of the present invention.

Subsequently, as shown in FIG. 18, by using a photoresist as a mask (not shown), boron is ion-implanted into a base-formation intended region 28 of the bipolar transistor to form an n-type impurity region 10 having a low donor concentration and, boron is ion-implanted also to form a separation region 8 and a p-well 9.

Figure 19:
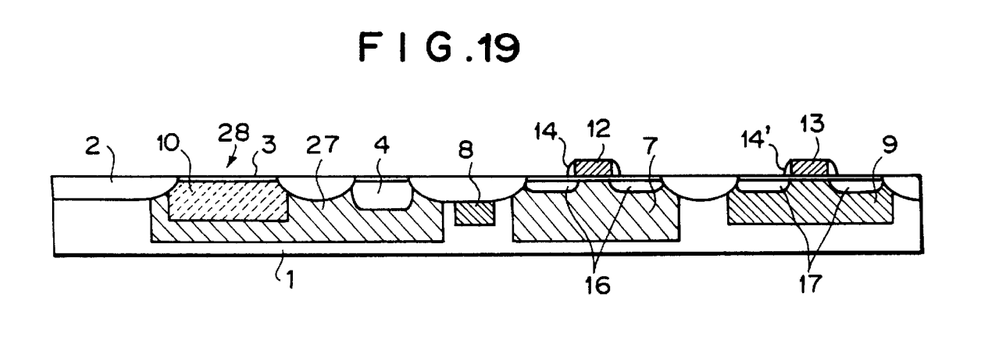
FIG. 19 is a cross-sectional view showing a subsequent process of the embodiment 2 of the present invention.

Subsequently, as shown in FIG. 19, a polysilicon layer which is grown at a thickness 1500 to 2000 angstroms on the overall surface is etched to form the gate electrode 12 of PMOS transistor and the gate electrode 13 of NMOS transistor. Thereafter, a silicon oxide film is deposited at a thickness of 1000 angstroms, and an anisotropic dry etching is performed to form side walls 14, 14' on the side surfaces of the respective gate electrodes 12 and 13. Subsequently, boron is ion-implanted at a dose amount of 5 to $9\times10^{15}$cm$^{-2}$ into the gate electrode 12 and the source and drain regions 16 of PMOS transistor. Further, arsenic is ion-implanted at a dose amount of 1 to $2\times10^{16}$cm$^{-2}$ into the gate electrode 13 and the source and drain electrodes 17 of NMOS transistor.

Figure 20:
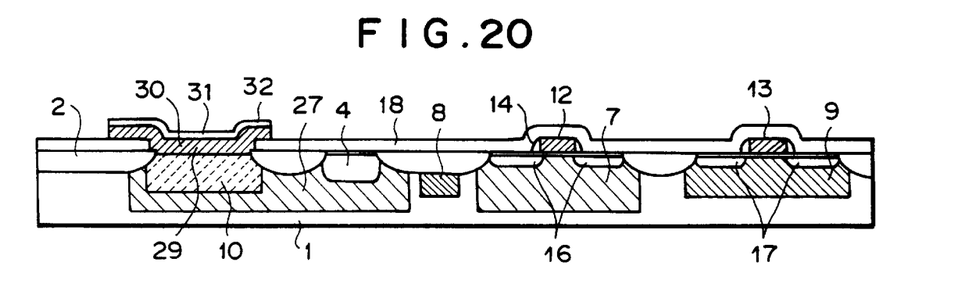
FIG. 20 is a cross-sectional view showing a subsequent process of the embodiment 2 of the present invention.

Subsequently, as shown in FIG. 20, a base contact hole (opening) 29 is formed in a silicon oxide film which is grown at a thickness of 1000 to 2000 angstroms on the overall surface, and then a polysilicon layer 30 is grown at a thickness of 1500 to 2000 angstroms on the overall surface. Subsequently, boron is doped to the overall surface of the polysilicon layer 30 at a dose amount of 5 to $10\times10^{15}$cm$^{-2}$, then a silicon nitride film 31 of 1500 to 2000 angstroms is deposited on the overall surface, and then the patterning is performed to form a base electrode 32.

Figure 21:
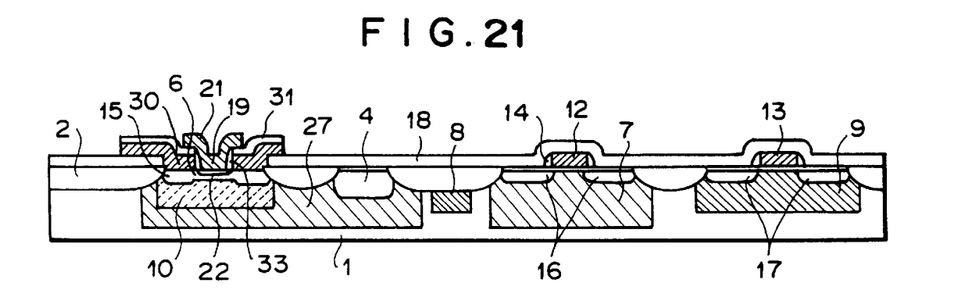
FIG. 21 is a cross-sectional view showing a subsequent process of the embodiment 2 of the present invention.

Subsequently, as shown in FIG. 21, the nitride film 31 and the polysilicon layer 30 of the base electrode 32 are etched to form an emitter contact hole (opening) 19. Thereafter, a silicon nitride film is deposited at a thickness of 1000 to 1500 angstroms on the overall surface, and then an anisotropic dry etching is performed to form a side wall 33 on the side surface of the inner wall of the emitter contact 19, namely on the side surface of the inner wall of the base electrode 32. Thereafter, boron is doped at a dose amount of 3 to $7\times10^{10} \text{cm}^{-2}$ to the substrate 1 through the emitter contact 19 to form a base region 6. Subsequently, arsenic is ion-implanted in dose amount of 1 to $2\times10^{16} \text{cm}^{-2}$ into a polysilicon layer which is grown at a thickness of 1500 to 2000 angstroms on the overall surface, and then patterning is performed to form an emitter electrode 21. Thereafter, the heat treatment is performed to diffuse boron and arsenic from the base electrode 32 and the emitter electrode 21 respectively to the substrate 1, thereby forming a graft base region 15 and an emitter region 22.

Figure 22:
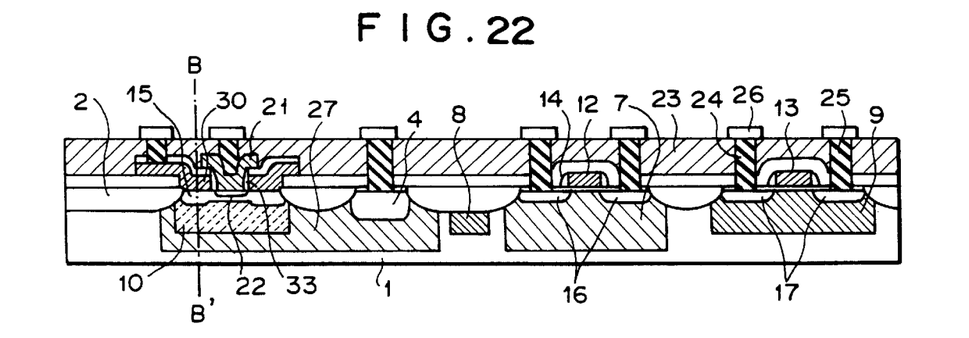
FIG. 22 is a cross-sectional view showing a subsequent process of the embodiment 2 of the present invention.

Subsequently, as shown in FIG. 22, an interlayer insulating film 23 is deposited on the elements which has been formed in the above process, and a contact hole (opening) 24 is formed. Thereafter, a plug 25 made of tungsten or the like is formed, and metal wire 26 is formed to thereby obtain a semiconductor device.

Figure 23:
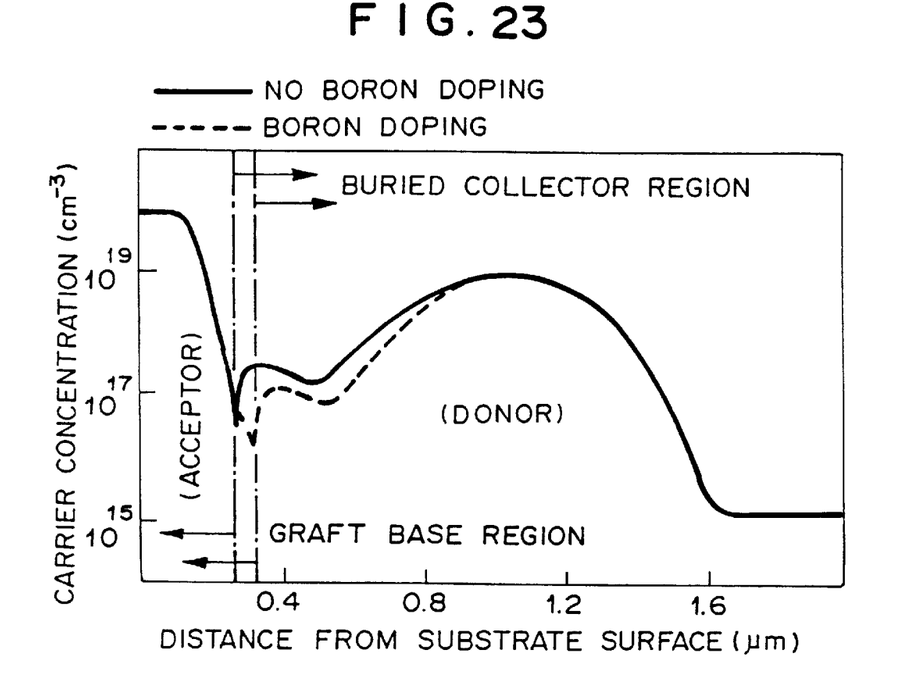
FIG. 23 is a diagram showing a carrier concentration distribution on a line B–B' of FIG. 22.
Figure 24:
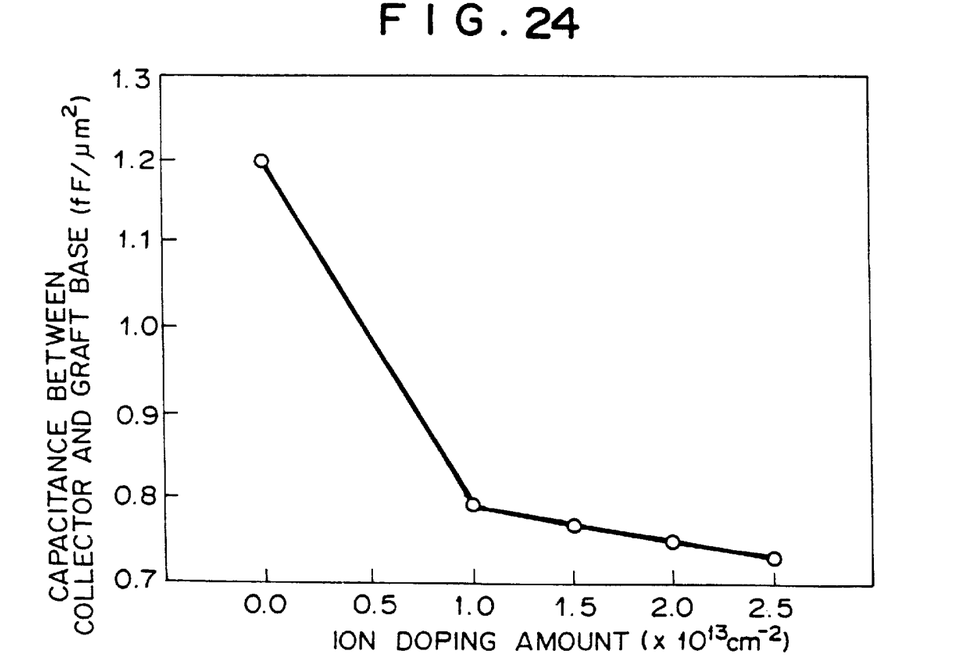
FIG. 24 is a diagram showing dependence of collector-base capacitance on boron doping amount.

In the embodiment 2, as shown in FIG. 23, the concentration of the impurities of the buried collector region 27 which are of n-type is compensated to reduce the donor concentration, and the junction capacitance between the graft base and the buried collector is reduced. FIG. 24 is a diagram showing the dependence of the junction capacitance between the collector and the graft base on the boron dose amount at an energy of 300 KeV when phosphor is doped (1) at an energy of 900 KeV and at a dose amount of $3\times10^{14} \text{cm}^{-2}$, then (2) at an energy of 100 KeV and at a dose amount of $4\times10^{12} \text{cm}^{-2}$ and then (3) at an energy of 30 KeV and at a dose amount of $7\times10^{12} \text{cm}^{-2}$ to form a buried collector region 27.

According to the embodiment 2, the parasitic capacitance can be reduced in the same manner as the embodiment 1. Furthermore, since after the buried collector region 27 is formed the low concentration n-type impurity region 10 is formed at a region where the base region 6 is to be formed, the impurity profile in the base region 6 can be readily set appropriately even if the buried collector region 27 and the n-well region 7 are formed by the same lithography process and the same ion-implantation process. Therefore the number of manufacturing steps can be reduced as compared with the embodiment 1 because the buried collector region 27 and the n-well region 7 can be formed simultaneously.

In the above-described embodiments, it is needless to say that the problem of the conventional manufacturing method can be solved even when the conduction type of the impurities to be doped is changed.

What is claimed is:

1. A method of manufacturing a semiconductor device having a bipolar transistor, comprising:

a step of doping second conduction type impurities into a first conduction type semiconductor substrate to form a buried collector region of the bipolar transistor; and a step of doping into a part of the buried collector region first conduction type impurities an amount of which is smaller than that of the second conduction type impurities to form a second conduction type impurity region.

2. The method of manufacturing a semiconductor device as claimed in claim 1, wherein a graft base region communicating to a base region of the bipolar transistor is formed adjacent to the second conduction type impurity region.

3. The method of manufacturing a semiconductor device as claimed in claim 2, wherein the second conduction type impurity region is formed after the base region is formed.

4. The method of manufacturing a semiconductor device as claimed in claim 1, wherein first conduction type impurities are doped into the second conduction type impurity region to form both a base region of the bipolar transistor and a graft base region communicating to the base region.

5. The method of manufacturing a semiconductor device as claimed in claim 1, wherein the buried collector region is formed while second conduction type impurities are doped into an area of the semiconductor substrate other than that of the bipolar transistor to form a second conduction type well for forming MOS transistor.

6. The method of manufacturing a semiconductor device as claimed in claim 1, wherein the second conduction type impurity region is formed while first conduction type impurities are doped into an area of the semiconductor substrate other than that of the bipolar transistor to form a first conduction type well for forming MOS transistor.

7. A method of manufacturing a semiconductor device having a bipolar transistor and CMOS transistor, comprising:

a step of doping second conduction type impurities into a first conduction type semiconductor substrate to form a buried collector region of the bipolar transistor, while second conduction type impurities are doped into a first area of the semiconductor substrate other than that of the bipolar transistor to form a second conduction type well for forming a first MOS transistor of the CMOS transistor; and a step of doping into a part of the buried collector region first conduction type impurities an amount of which is smaller than that of the second conduction type impurities to form a second conduction type impurity region, while first conduction type impurities are doped into a second area of the semiconductor substrate other than that of the bipolar transistor to form a first conduction type well for forming a second MOS transistor of the CMOS transistor.

* * * * *